United States Patent
Nawaz

(10) Patent No.: US 9,064,963 B2
(45) Date of Patent: Jun. 23, 2015

(54) SEMICONDUCTOR STRUCTURE

(75) Inventor: Muhammad Nawaz, Norsborg (SE)

(73) Assignee: Infineon Technologies AG, Neubiberg (DE)

( * ) Notice: Subject to any disclaimer, the term of this patent is extended or adjusted under 35 U.S.C. 154(b) by 683 days.

(21) Appl. No.: 11/864,149

(22) Filed: Sep. 28, 2007

(65) Prior Publication Data

US 2009/0085114 A1 Apr. 2, 2009

(51) Int. Cl.
| | |
|---|---|
| *H01L 29/15* | (2006.01) |
| *H01L 29/786* | (2006.01) |
| *H01L 21/762* | (2006.01) |
| *H01L 29/10* | (2006.01) |
| *H01L 29/51* | (2006.01) |
| *H01L 29/78* | (2006.01) |

(52) U.S. Cl.
CPC ...... *H01L 29/78603* (2013.01); *H01L 21/7624* (2013.01); *H01L 29/1079* (2013.01); *H01L 29/517* (2013.01); *H01L 29/785* (2013.01)

(58) Field of Classification Search
USPC .......................................................... 257/76
See application file for complete search history.

(56) References Cited

U.S. PATENT DOCUMENTS

| 8,673,704 B2 * | 3/2014 | Zhu et al. ........................ 438/164 |
| 2004/0256647 A1 * | 12/2004 | Lee et al. ........................ 257/289 |
| 2005/0093059 A1 * | 5/2005 | Belyansky et al. ............ 257/327 |
| 2006/0001018 A1 * | 1/2006 | Chow et al. ....................... 257/20 |
| 2006/0084212 A1 * | 4/2006 | Anderson et al. ............... 438/197 |
| 2006/0113522 A1 * | 6/2006 | Lee et al. .......................... 257/18 |
| 2006/0197126 A1 * | 9/2006 | Lochtefeld et al. ............ 257/288 |
| 2007/0235763 A1 * | 10/2007 | Doyle et al. .................... 257/202 |

OTHER PUBLICATIONS

Madelung, Oddfriend, ed. Semiconductors—basic data. Berlin: Springer, 1996. Print.*
N. Dietz, S. Habermehl, J. T. Kelliher, G. Lucovsky, K. J. Bachmann, Growth and Characterization of Si—GaP and Si—GaP—Si Heterostructures, Mat. Res. Soc. Symp. Proc. vol. 334, pp. 495-500.*

* cited by examiner

*Primary Examiner* — Mark Tornow
(74) *Attorney, Agent, or Firm* — Slater & Matsil, L.L.P.

(57) ABSTRACT

A semiconductor structure includes a substrate, an undoped GaP insulating layer formed over the substrate, and a semiconductor layer formed over the GaP layer.

4 Claims, 8 Drawing Sheets

US 9,064,963 B2

SEMICONDUCTOR STRUCTURE

BACKGROUND

Metal-Oxide Semiconductor Field-Effect Transistors (MOSFETs) have been scaled down in size in order to improve their cost and performance. Minimum feature sizes have been reduced to dimensions that are now less than 100 nanometers (nm). When channel lengths are reduced to these levels, leakage currents such as off-state leakage currents can be significantly increased.

One approach that has been used to overcome the problems associated with short channel lengths is to fabricate the MOSFETs on Silicon On Insulator (SOI) wafers. Types of SOI wafers can include, for example, Separation by IMplantation of Oxygen (SIMOX) wafers. When MOSFETs are fabricated on SOI wafers, off-state leakage currents are reduced. For example, leakage currents that result from drain-induced barrier lowering are reduced because the buried oxide layer can block the lateral penetration of the drain induced electric field. One type of MOSFET that can be fabricated on SOI wafers is a multi-gate field effect transistor (MuGFET) that uses more than one gate. FinFETs, for example, are double-gate devices in which silicon is etched into a fin-shaped structure and the gate is formed around and over the fin. Another type of MOSFET that can be fabricated on SOI wafers is an Ultra-Thin Body (UTB) MOSFET that operates in a fully depleted mode. Other approaches that have been used are to fabricate the MOSFETs on Silicon Germanium (SiGe) on Insulator (SGOI) substrates or on Ge on Insulator (GOI) substrates. Both SGOI MOSFETs and GOI MOSFETs have shown significant carrier mobility enhancement and improved scaling properties compared to MOSFETs fabricated on Si wafers.

One problem that MOSFETs fabricated on SOI, SGOI or GOI substrates have is self-heating. Self-heating is caused by a conversion of electrical energy into thermal energy that results in increased lattice temperatures, degraded electron mobility, and reduced transconductance and channel current. Self-heating results because of the difference between the thermal conductivities of silicon dioxide ($SiO_2$), SiGe, Ge and Si. The thermal conductivity of Si is 1.5 W/cm-° C. which is greater than the thermal conductivity of $SiO_2$ (0.014 W/cm-° C.), the thermal conductivity of $Si_{0.75}Ge_{0.25}$ (0.085 W/cm-° C.) or the thermal conductivity of Ge (0.6 W/cm-° C.)

SUMMARY

One embodiment provides a semiconductor structure. The semiconductor structure includes a substrate, an undoped GaP insulating layer formed over the substrate and a semiconductor layer formed over the GaP layer.

BRIEF DESCRIPTION OF THE DRAWINGS

The accompanying drawings are included to provide a further understanding of embodiments of the invention and are incorporated in and constitute a part of this specification. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology such as "top" or "bottom" are used with reference to the orientation of the Figure(s) being described. Because components of embodiments of the invention can be positioned in a number of different orientations, the directional terminology is used for purposes of illustration and is in no way limiting. It is understood that other embodiments may be utilized and structural or logical changes made without departing from the scope of the invention. The following detailed description, therefore, is not to be taken in a limiting sense, and the scope of the invention is defined by the appended claims.

Figure 1:
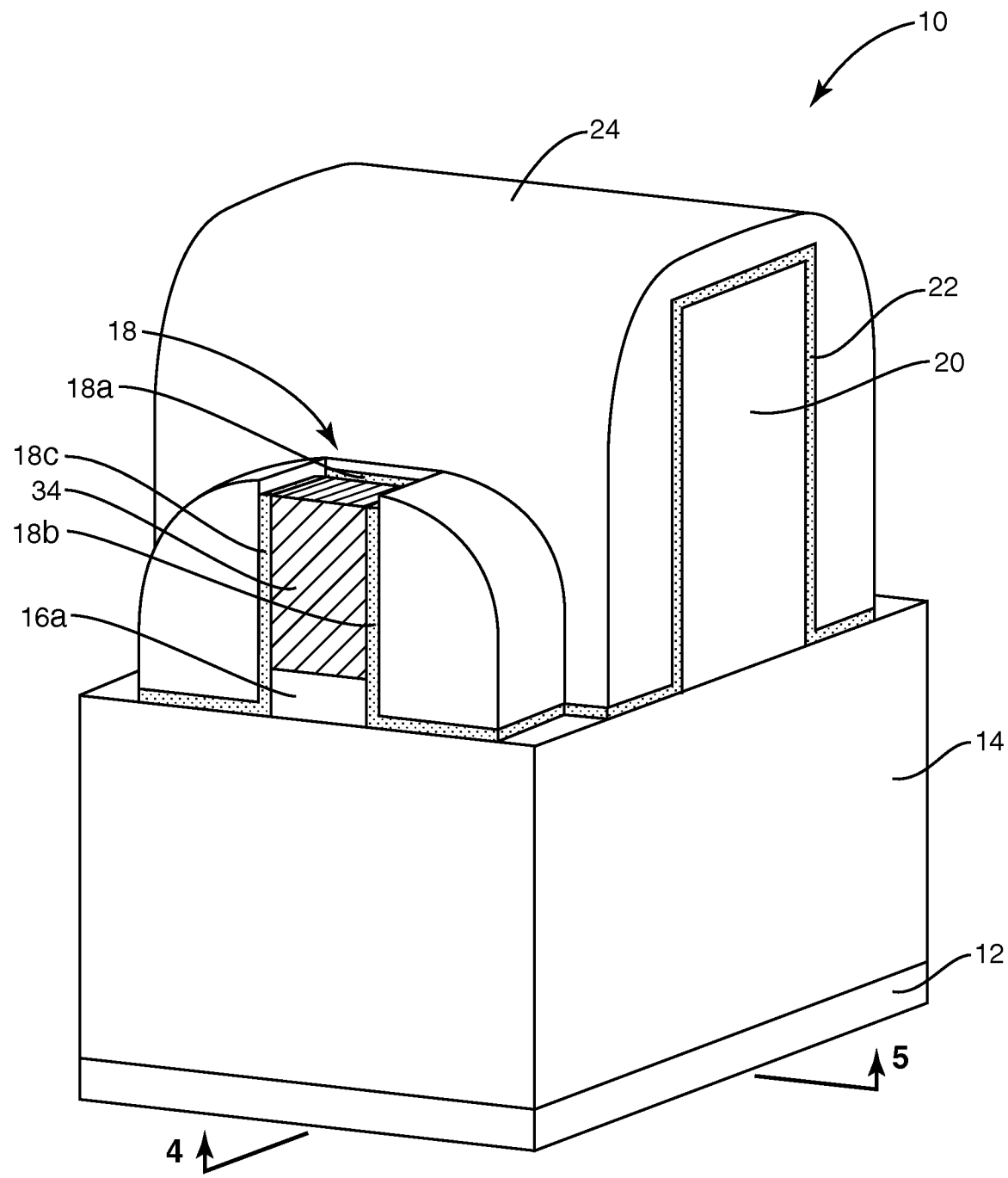
FIG. 1 is a perspective view of one embodiment of a field-effect transistor.
Figure 2:
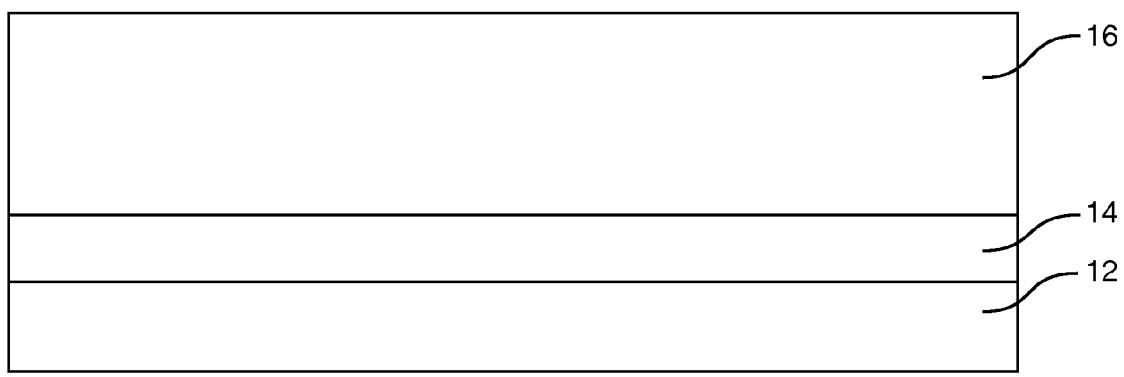
FIG. 2 is a cross-sectional view of one embodiment of a semiconductor structure.

FIG. 1 is a perspective view of one embodiment of field-effect transistor 10. FIG. 2 is a cross-sectional view of one embodiment of a semiconductor structure. Referring to FIGS. 1 and 2, substrate 12 comprises Si and can be formed using any suitable process. These processes include, but are not limited to, Molecular Beam Epitaxy (MBE) or Metal-Organic Chemical Vapor Deposition (MOCVD). In other embodiments, substrate 12 comprises other suitable materials including semiconductor or non-semiconductor materials. Field-effect transistor 10 further comprises an undoped wide bandgap Gallium Phosphide (GaP) insulating layer 14. In the illustrated embodiment, GaP layer 14 is formed over Si layer 12. In various embodiments, GaP layer 14 has a thickness that is within a range of 50-150 nm. In other embodiments, GaP layer 14 can have other suitable thicknesses. In one embodiment, GaP layer 14 has a thermal conductivity that is 1.1 W/cm-° C. In various embodiments, GaP layer 14 is a compound semiconductor that is electrically non-conductive. In the illustrated embodiment, GaP layer 14 can be formed over Si layer 12 because of a small lattice mismatch with Si layer 12. In one embodiment, the lattice mismatch is less than 0.4%. In one embodiment, the lattice constant of GaP layer 14 is 5.4505 Å at 300 K and the lattice constant of Si layer 12 is 5.431 Å at 300 K. In various embodiments, self-heating effects which can include degraded electron mobility and saturation velocity and reduced transconductance are improved when compared to MOSFETs fabricated on a SOI wafer or on a $SiO_2$ layer. This results in the illustrated embodiment because the thermal conductivity of GaP which is 1.1 W/cm-° C. is greater than the thermal conductivity of $SiO_2$ which is 0.014 W/cm-° C. In various embodiments, GaP layer 14 has a wide bandgap (2.26 eV), a low intrinsic carrier concentration (2 $cm^{-3}$), a high dielectric constant (11.1), a high breakdown field ($1 \times 10^6$ V/cm), a high intrinsic resistivity and thermal stability. In various embodiments, field-effect transistor 10 is suitable for use in high temperature applications that can include, but are not limited to, jet aircraft engines and electronic systems for satellites.

In the illustrated embodiment, a semiconductor layer is formed over GaP layer 14. In one embodiment, the semiconductor layer comprises Si. In one embodiment, the semiconductor layer comprises $Si_{1-x}Ge_x$, where x is within a range of 0.1 to 0.25. In other embodiments, x can have other suitable values. In other embodiments, a Si layer is formed over the $Si_{1-x}Ge_x$ layer. In this embodiment, the Si layer is a strained Si layer. In one embodiment, the semiconductor layer comprises Ge. In other embodiments, the semiconductor layer comprises other suitable materials.

In one embodiment, Si layer 16 and GaP layer 14 are grown in a single epitaxy step. This may provide a sharp and high quality interface between Si layer 16 and GaP layer 14. In this embodiment, Si layer 16 may be doped during the single step and may be doped using a p-type dopant, an n-type dopant, or both a p-type dopant and an n-type dopant. In various embodiments, suitable methods to form GaP layer 14 over Si layer 12 or to form Si layer 16 over GaP layer 14 include, but are not limited to, MBE or MOCVD.

Figure 3:
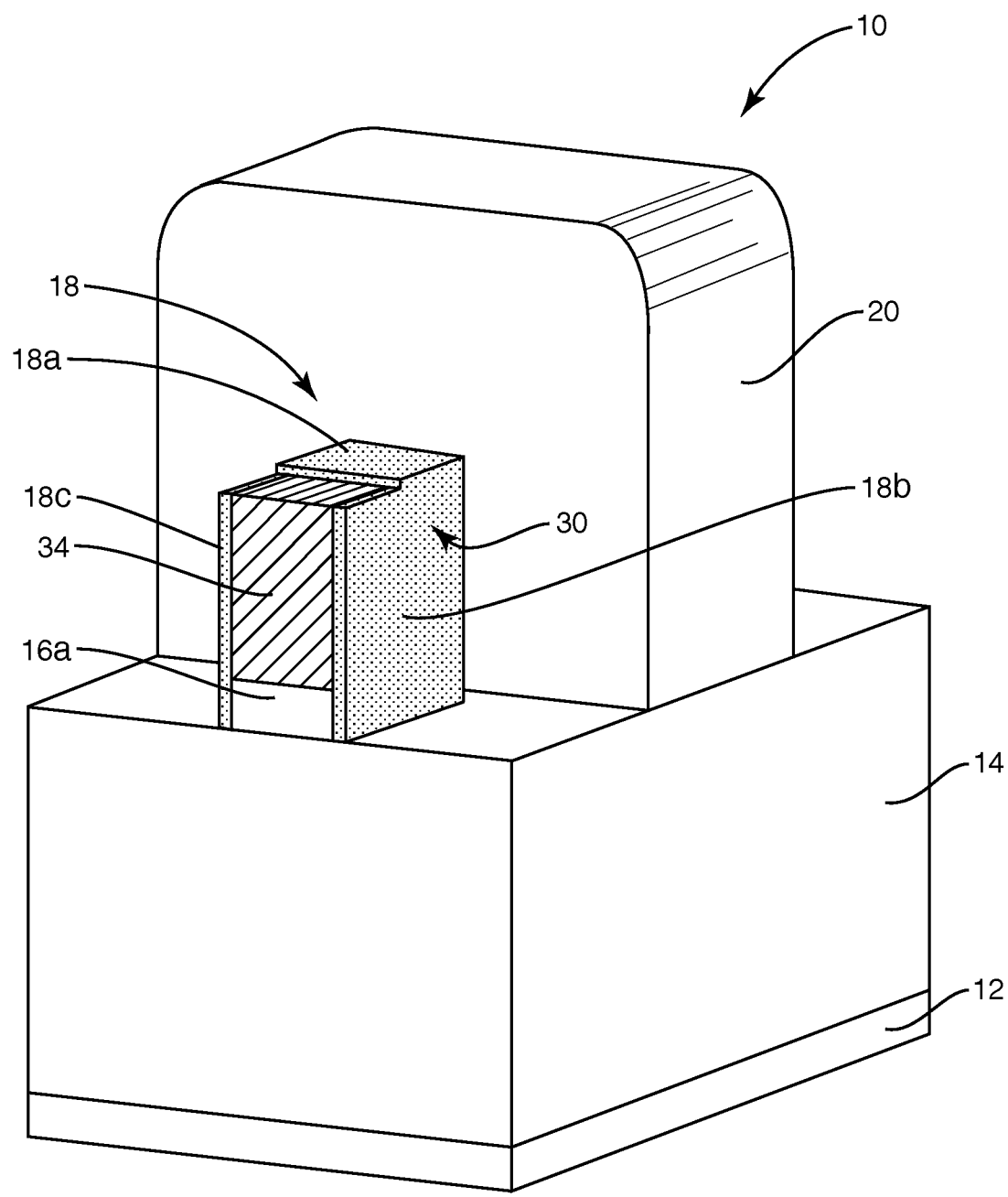
FIG. 3 is a partial perspective view of one embodiment of the field-effect transistor illustrated in FIG. 1.

FIG. 3 is a partial perspective view of one embodiment of the field-effect transistor 10 illustrated in FIG. 1. In this embodiment, Si layer 16 has been patterned into a rectangular or fin-shaped structure as illustrated at 16a. In other embodiments, Si layer 16 can be patterned into a structure that has any suitable number of sides, such as two or more sides. Si structure 16a includes drain, source and channel regions for field-effect transistor 10. The drain/source region is illustrated at 30 and the source/drain region is illustrated at 32 (not shown, see FIG. 4). In various embodiments, Si layer 16 can be patterned using suitable lithography and/or dry etching operations. In the illustrated embodiment, Si structure 16a has a height (between GaP layer 14 and gate oxide portion 18a) that is within a range of 10-60 nm and has a width (between gate oxide portions 18b and 18c) that is within a range of 10-30 nm. In other embodiments, Si structure 16a can have other suitable heights and/or widths. In the illustrated embodiment, Si layer 16 can be doped to form a p-channel field-effect transistor 10 or an n-channel field effect transistor 10. In some embodiments, the doping concentration of Si layer 16 is within a range of $1.0 \times 10^{16}$-$1.0 \times 10^{18}$ $cm^{-3}$. In other embodiments, Si layer 16 can have doping concentrations that have other suitable values. In the illustrated embodiment, the doping concentration defines the threshold voltage of the p-channel transistor or the n-channel transistor.

In the illustrated embodiment, after Si structure 16a is formed over GaP layer 14, a sacrificial oxidation may be performed to remove any damage that results when Si layer 16 is patterned. In this embodiment, the sacrificial oxide can be removed using suitable wet etch chemistry such as a dilute hydrofluoric acid (HF) etch before the gate dielectric process. In various embodiments, the sacrificial oxide can have a thickness that is within a range of 3-8 nm. In other embodiments, the sacrificial oxide thickness can have other suitable values.

In the illustrated embodiment, a gate oxide 18 is formed over Si structure 16a. In various embodiments, gate oxide 18 can be thermally grown and may comprise $SiO_2$ or other materials such as high-K materials. Suitable materials can include, but are not limited to, $TaO_5$, $HFO_2$, SiN, SiON or $ZrO_2$. In the illustrated embodiment, gate oxide portions 18a, 18b or 18c have a thickness that is within a range of 1-3 nm. In other embodiments, gate oxide portions 18a, 18b or 18c can have other suitable thicknesses. The extent of gate oxide 18 over Si structure 16a (e.g. as shown by gate oxide portions 18a, 18b and 18c) is exemplary and illustrates that gate oxide 18 is formed over three sides of Si structure 16a. In other embodiments, gate oxide 18 can include any one, any two, or all three of gate oxide portions 18a, 18b or 18c, and gate 20 can be patterned over only one, over any two, or over all three of gate oxide portions 18a, 18b and 18c.

In the illustrated embodiment, gate 20 is formed from suitable materials that include, but are not limited to, polycrystalline silicon, polycrystalline silicon-germanium, titanium nitride (TiN) or titanium silicon nitride (TiSiN). In some embodiments, gate 20 can be formed from any metal that has a suitable work function. In these embodiments, the work function can be adjusted to define or control the threshold voltage of field-effect transistor 10. Gate 20 can be patterned using any suitable etching process such as a dry etch process. A channel region for field-effect transistor 10 is within the portion of Si structure 16a that is proximate to and under gate 20.

Figure 4:
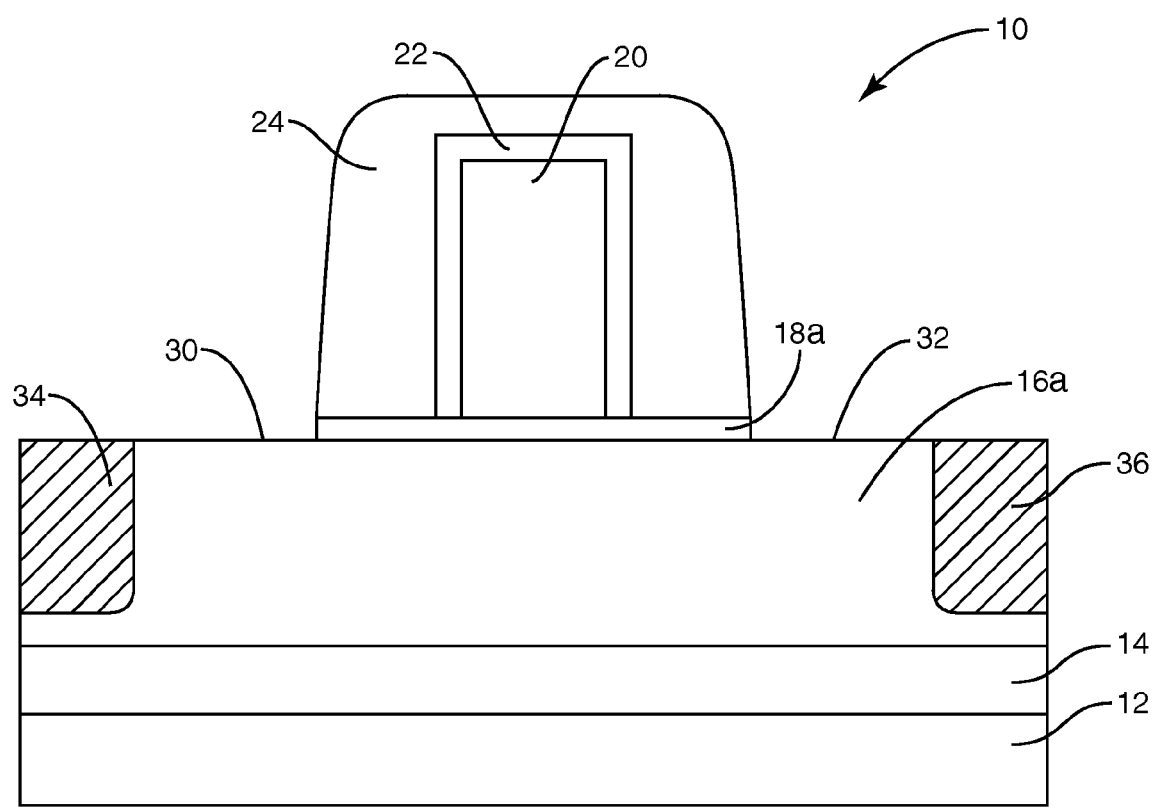
FIG. 4 is a cross-sectional view of one embodiment of the field-effect transistor illustrated in FIG. 1 taken along lines 4-4.
Figure 5:
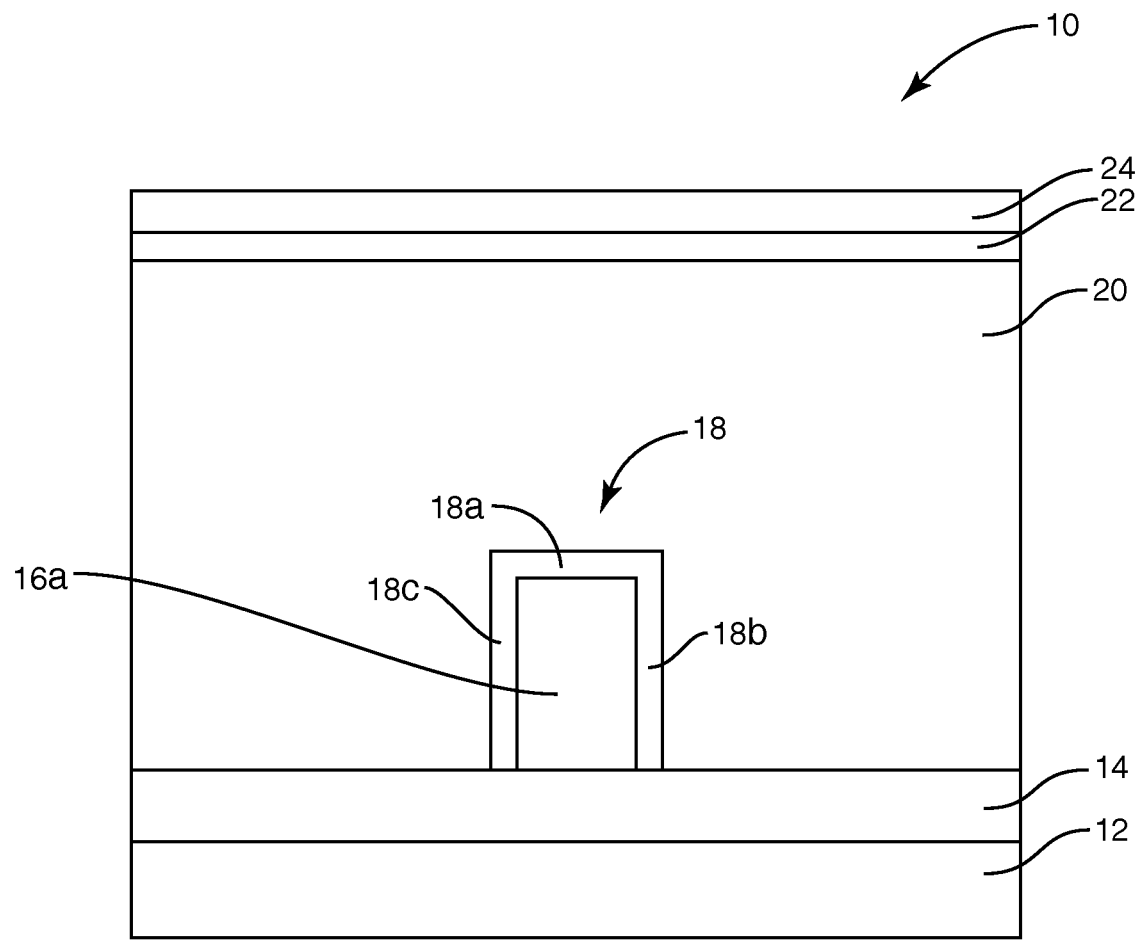
FIG. 5 is a cross-sectional view of one embodiment of the field-effect transistor illustrated in FIG. 1 taken along lines 5-5.

FIG. 4 is a cross-sectional view of one embodiment of the field-effect transistor 10 illustrated in FIG. 1 taken along lines 4-4. FIG. 5 is a cross-sectional view of one embodiment of the field-effect transistor 10 illustrated in FIG. 1 taken along lines 5-5. Referring to FIGS. 4 and 5, after gate 20 is patterned, a re-oxidation layer 22 can be formed over gate 20. In one embodiment, re-oxidation layer 22 has a thickness that is within a range of 4-8 nm. In other embodiments, re-oxidation layer 22 can have other suitable thicknesses or is not used.

In the illustrated embodiment, a silicon nitride ($Si_3N_4$) spacer 24 is formed over gate 20. In one embodiment, nitride spacer 24 can have a thickness that is within a range of 25 to 100 nm. In other embodiments, nitride spacer 24 can utilize other materials and have other suitable thicknesses. In the illustrated embodiment, a directional etch process can be used to remove portions of nitride spacer 24 from surfaces of Si structure 16a (e.g. proximate to drain/source 30 and source/drain 32), while leaving portions of nitride spacer 24 along the vertical portions of the gate 20. Regions of gate oxide 18 that are proximate to drain/source 30 and source/drain 32 can be removed using suitable wet etch chemistry such as a hydrofluoric acid etch.

In the illustrated embodiment, an electrical contact to drain/source 30 is provided by electrical contact 34 and an electrical contact to source/drain 32 is provided by electrical contact 36. Any suitable material such as a metal can be used to form electrical contacts 34 and 36. The dimensions of electrical contacts 34 and 36 (e.g. the depth and/or width) and the spacing of electrical contacts 34 and 36 from gate 20 as illustrated in FIG. 4 are for illustrative purposes and can be different in other embodiments.

In the embodiments illustrated in FIG. 4 or FIG. 5, one or more implants can be performed to define drain/source 30 and source/drain 32. The one or more implants can be performed before or after the nitride spacer 22 is formed over gate 20. Depending on whether n-channel or p-channel field effect transistors are being formed, the dopants used can include, but are not limited to, arsenic (As) or boron (B). In one embodiment, a rapid thermal annealing can be performed to activate the regions for drain/source 30 and source/drain 32 that are formed by the implant step. In one embodiment, the annealing is performed at a temperature that is within a range of 900° C. to 1100° C. In other embodiments, other suitable temperatures can be used. In one embodiment, a Self-Aligned Silicide (salicide) process can be used to form contacts to one or more of the drain/source 30, source/drain 32 or gate 20. The salicide process can be implemented using suitable materials that include, but are not limited to, $CoSi_2$, TiSi or NiSi.

Figure 6:
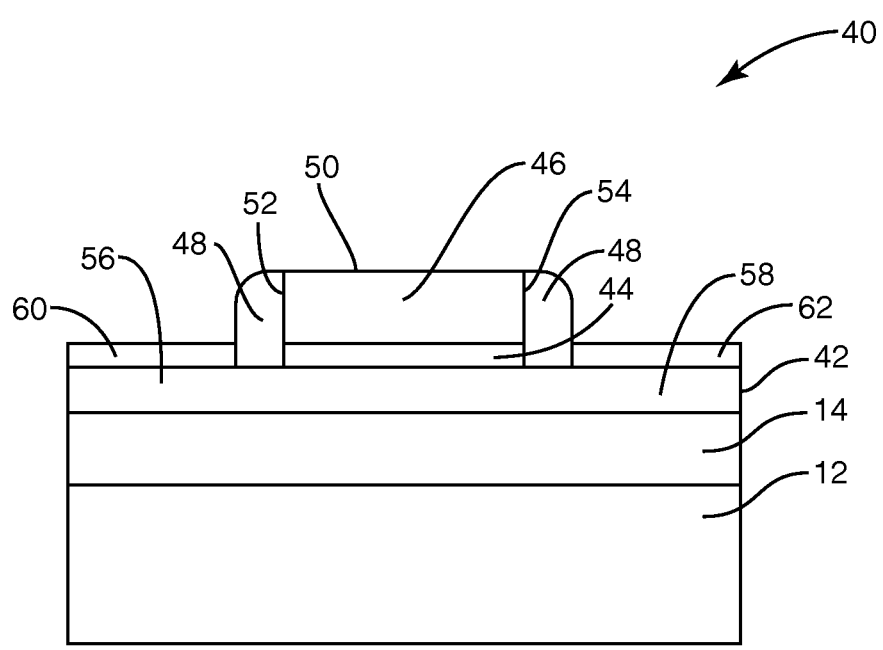
FIG. 6 is a cross-sectional view of one embodiment of a field-effect transistor.

FIG. 6 is a cross-sectional view of one embodiment of a field-effect transistor 40. Field effect transistor 40 includes a substrate 12 and GaP layer 14. In one embodiment, layer 42 comprises Si and is formed over GaP layer 14. In one embodiment, Si layer 42 and GaP layer 14 are grown in a single epitaxy step. This may provide a sharp and high quality interface between Si layer 42 and GaP layer 14. In this embodiment, Si layer 42 may be doped during the single step and may be doped using a p-type dopant, an n-type dopant, or both a p-type dopant and an n-type dopant. In various embodiments, suitable methods to form Si layer 42 over GaP layer 14 include, but are not limited to, MBE or MOCVD. In the illustrated embodiment, Si layer 42 has a thickness that is within a range of 15-20 nm. In other embodiments, Si layer 42 can have other suitable thicknesses.

In the illustrated embodiment, a gate oxide 44 is formed over Si layer 42. In various embodiments, gate oxide 44 can be thermally grown and may comprise $SiO_2$ or other suitable materials such as high-K materials. The materials can include, but are not limited to, $TaO_5$, $HFO_2$, SiN, SiON or $ZrO_2$. A gate 46 is formed over gate oxide 44 from suitable materials that include, but are not limited to, polycrystalline silicon, polycrystalline silicon-germanium, titanium nitride (TiN) or titanium silicon nitride (TiSiN). In some embodiments, gate 46 can be formed from any metal that has a suitable work function. In these embodiments, the work function can be adjusted to define or control the threshold voltage of field-effect transistor 40. Gate 46 can be patterned using a suitable etch process such as a dry etch process.

In the illustrated embodiment, a silicon nitride ($Si_3N_4$) spacer 48 is formed over gate 46. In this embodiment, nitride spacer 48 has a thickness that is within a range of 25 to 100 nm thick. In other embodiments, nitride spacer 48 can have other suitable thicknesses and can use other suitable materials. A directional etch process can be used to remove portions of nitride spacer 48 from a surface 50 of gate 46 while leaving portions of nitride spacer 48 along sides 52 and 54 of gate 46.

In the illustrated embodiment, one or more implants can be performed to define a drain/source 56 and a source/drain 58. In various embodiments, the one or more implants can be performed before or after nitride spacer 48 is formed over gate 46. Depending on whether n-channel or p-channel field effect transistors are being defined, the dopants used can include, but are not limited to, As or B. In one embodiment, a rapid annealing can be performed after the one or more implants are completed.

In various embodiments, a salicide process can be used to form contacts to one or more of the drain/source 56, source/drain 58 or gate 46. In these embodiments, the salicide process can be implemented using suitable materials that include, but are not limited to, $CoSi_2$, TiSi or NiSi. A suitable material such as a metal can be deposited to provide an electrical contact 60 to drain/source 56 and an electrical contact 62 to source/drain 58 of field-effect transistor 40.

Figure 7:
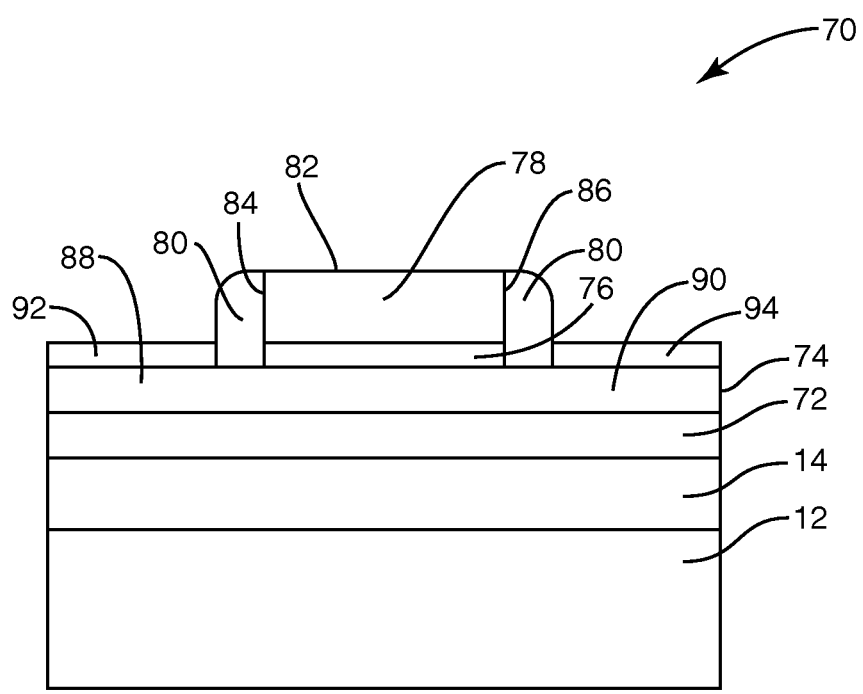
FIG. 7 is a cross-sectional view of one embodiment of a field-effect transistor.

FIG. 7 is a cross-sectional view of one embodiment of a field-effect transistor. 70. Field effect transistor 70 includes a substrate 12 and GaP layer 14. In one embodiment, $Si_{1-x}Ge_x$ layer 72 is formed over GaP layer 14, where x is within a range of 0.1 to 0.25. In other embodiments, x can have other suitable values. The lattice constant of SiGe layer 72 can be set to a suitable value depending on the composition x of Ge. In this embodiment, GaP layer 14 is grown to a thickness that is within a range of 50-150 nm and SiGe layer 72 is grown to a thickness that is within a range of 10-50 nm. In other embodiments, GaP layer 14 and SiGe layer 72 can have other suitable thicknesses. Next, Si layer 74 is formed over SiGe layer 72. Si layer 74 is a strained channel layer and is grown to a thickness that is within a range of 10-20 nm. In other embodiments, Si layer 74 can have other suitable thicknesses.

In one embodiment, Si layer 74, SiGe layer 72 and GaP layer 14 are grown in a single epitaxy step. In this embodiment, Si layer 74 may be doped during the single step and may be doped using a p-type dopant, an n-type dopant, or both a p-type dopant and an n-type dopant. In various embodiments, suitable methods to form GaP layer 14 over Si layer 12, to form SiGe layer 72 over GaP layer 14, or to form Si layer 74 over SiGe layer 72 include, but are not limited to, MBE or MOCVD.

Figure 8:
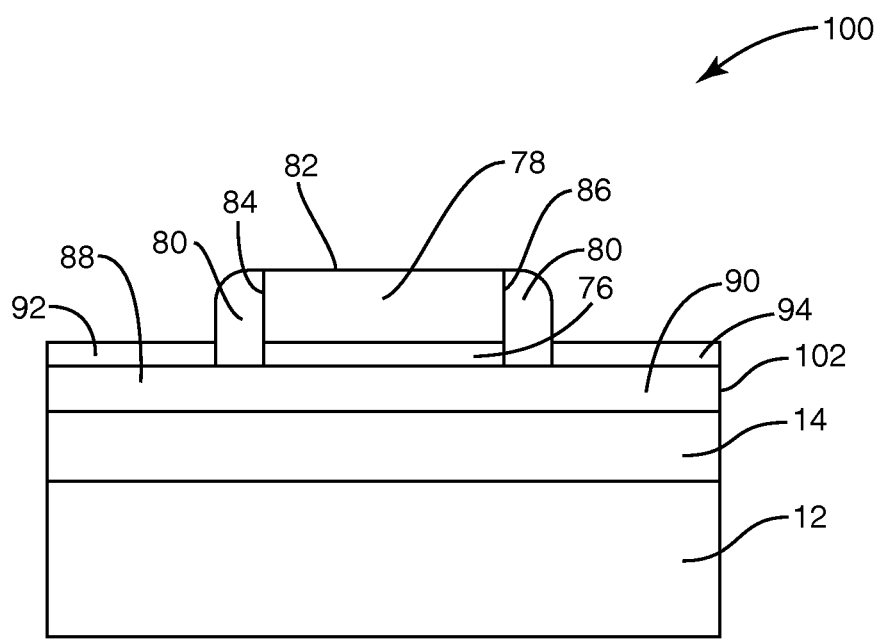
FIG. 8 is a cross-sectional view of one embodiment of a field-effect transistor.

FIG. 8 is a cross-sectional view of one embodiment of a field-effect transistor. 100. Field effect transistor 100 includes a substrate 12 and GaP layer 14. In one embodiment, Ge Layer 102 is formed over GaP layer 14. Ge Layer 102 can be formed over GaP layer 14 by using suitable methods such as epitaxy to form a $Si_{1-x}Ge_x$ layer over GaP layer 14 and subsequent steps that include thermal oxidation of the $Si_{1-x}Ge_x$ layer to form Ge layer 102.

Referring to FIGS. 7 and 8, in various embodiments, gate oxide 76 can be formed over Si layer 74 or over Ge layer 102. Gate oxide 76 can be thermally grown and may comprise $SiO_2$ or other suitable materials such as high-K materials. The materials can include, but are not limited to, $TaO_5$, $HFO_2$, SiN, SiON or $ZrO_2$. In various embodiments, gate oxide 76 has a thickness that is within a range of 1-3 nm. In other embodiments, gate oxide 76 can have a thickness that has other suitable values.

A gate 78 is formed over gate oxide 76 from suitable materials that include, but are not limited to, polycrystalline silicon, polycrystalline silicon-germanium, titanium nitride (TiN) or titanium silicon nitride (TiSiN). In some embodiments, gate 78 can be formed from any metal that has a suitable work function. In these embodiments, the work function can be adjusted to define or control the threshold voltage of field-effect transistor 70. Gate 78 can be patterned using a suitable etch process such as a dry etch process. In various embodiments the gate length can be within a range of 30-100 nm. In other embodiments the gate length can have other suitable values.

In the illustrated embodiment, a silicon nitride ($Si_3N_4$) spacer 80 is formed over gate 78. In this embodiment, nitride spacer 80 has a thickness that is within a range of 25 to 100 nm thick. In other embodiments, nitride spacer 80 can have other suitable thicknesses and can use other suitable materials. A directional etch process can be used to remove portions of nitride spacer 80 from a surface 82 of gate 78 while leaving portions of nitride spacer 80 along sides 84 and 86 of gate 78.

In the illustrated embodiment, one or more implants can be performed to define a drain/source 88 and a source/drain 90. In various embodiments, the one or more implants can be performed before or after nitride spacer 80 is formed over gate 78. Depending on whether n-channel or p-channel field effect transistors are being defined, the dopants used can include, but are not limited to, As or B. In one embodiment, a rapid annealing can be performed after the one or more implants are completed.

A salicide process can be used in one embodiment to form contacts to one or more of the drain/source 88, source/drain 92 or gate 78. In this embodiment, the salicide process can be implemented using suitable materials that include, but are not limited to, $CoSi_2$, TiSi or NiSi. A suitable material such as a metal can be deposited to provide an electrical contact 92 to drain/source 88 and an electrical contact 94 to source/drain 92 of field-effect transistor 70.

Although specific embodiments have been illustrated and described herein, it will be appreciated by those of ordinary skill in the art that a variety of alternate and/or equivalent implementations may be substituted for the specific embodiments shown and described without departing from the scope of the invention. This application is intended to cover any adaptations or variations of the specific embodiments discussed herein. Therefore, it is intended that this invention be limited only by the claims and the equivalents thereof.

What is claimed is:

1. A field-effect transistor, comprising:
a substrate;
an undoped GaP layer overlying the substrate;
a $Si_{1-x}Ge_x$ layer overlying the GaP layer;
a fin-shaped Si structure overlying the $Si_{1-x}Ge_x$ layer, said fin-shaped Si structure including a source region and a drain region, wherein the undoped GaP layer and the $Si_{1-x}Ge_x$ layer substantially overlaps the substrate, and wherein the undoped GaP layer and the $Si_{1-x}Ge_x$ layer overlap more of the substrate than the fin-shaped Si structure; and
a gate overlying the fin-shaped Si structure.

2. The transistor of claim 1, wherein said substrate comprises Si.

3. The transistor of claim 1, wherein x is within the range of 0.1 to 0.25.

4. The transistor of claim 1, further comprising an electrical contact disposed in the fin-shaped Si structure, the electrical contact spaced away from the undoped GaP layer.

* * * * *